United States Patent
Teggatz et al.

(10) Patent No.: US 6,169,439 B1
(45) Date of Patent: Jan. 2, 2001

(54) CURRENT LIMITED POWER MOSFET DEVICE WITH IMPROVED SAFE OPERATING AREA

(75) Inventors: Ross Teggatz, McKinney; David J. Baldwin, Allen; Rex M. Teggatz, Richardson, all of TX (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/000,825

(22) Filed: Dec. 30, 1997

Related U.S. Application Data

(60) Provisional application No. 60/035,728, filed on Jan. 2, 1997.

(51) Int. Cl.[7] .................................................. H03K 5/08
(52) U.S. Cl. ............................ 327/309; 327/318; 327/427
(58) Field of Search ..................................... 327/309, 310, 327/312, 313, 314, 318, 319, 320, 321, 322, 323, 324, 325, 326, 327, 328, 389, 403, 404, 405, 419, 421, 427, 432, 434, 478, 482, 493, 502, 504, 574, 577, 581, 583, 584, 590

(56) References Cited

U.S. PATENT DOCUMENTS

| | | | |
|---|---|---|---|
| 5,001,373 | * | 3/1991 | Bator et al. ........................... 307/542 |
| 5,272,392 | * | 12/1993 | Wong et al. .......................... 307/270 |
| 5,272,399 | * | 12/1993 | Tihani et al. ........................ 307/572 |
| 5,561,391 | * | 10/1996 | Wellnitz et al. ..................... 327/309 |
| 5,608,595 | * | 3/1997 | Gourab et al. .......................... 361/79 |
| 5,793,232 | * | 8/1998 | Gallinari et al. ..................... 327/110 |
| 5,828,247 | * | 10/1998 | Moller et al. ........................ 327/110 |

* cited by examiner

Primary Examiner—Jeffrey Zweizig
(74) Attorney, Agent, or Firm—Wade James Brady, III; Frederick J. Telecky, Jr.

(57) ABSTRACT

An integrated circuit having a protected output field effect transistor (FET) (101). A drain-gate clamp circuit (105) is coupled to divert charge from the power FET drain electrode to the power FET gate electrode when excessive drain-source voltage is present. A drain-source current limit circuit (110) is coupled to divert charge from the power FET gate electrode to the power FET source electrode when a preselected drain-source current is achieved. A current limit inhibit circuit (115) is coupled between the current limit circuit and the power FET gate electrode, and having a control electrode coupled to the drain-gate clamp circuit. The current limit inhibit circuit (115) disables the current limit circuit (110) when charge flows in the drain-gate clamp circuit (105).

13 Claims, 1 Drawing Sheet

CURRENT LIMITED POWER MOSFET DEVICE WITH IMPROVED SAFE OPERATING AREA

This application claims priority under 35 USC §119(e)(1) of provisional application Ser. No. 60/035,728 filed Jan. 2, 1997.

BACKGROUND OF THE INVENTION

1. Field of the Invention

The present invention relates, in general to power metal oxide semiconductor (MOS) devices and, more particularly to a current limited power MOSFET device with improved safe operating area.

2. Relevant Background

Due to their ability to rapidly switch high currents and high voltages, power metal oxide semiconductor (MOS) devices are gaining popularity in power switching circuits. Power switches are generally defined as switches capable of handling greater than 0.5 amperes current and voltage ranges from 25 volts to greater than 1 kV. Power MOSFET devices are available to handle currents of tens and even hundreds of amperes.

Power MOSFET devices are widely used in the automotive industry for engine controllers, lamp drivers, antilock brake systems, and the like. In these applications the power MOSFET devices are incorporated into circuit boards and circuit module subassemblies. These subassemblies are then installed and assembled into finished products. These subassemblies may be exposed to severe electrical stress during assembly from such external sources as arc welders used to fasten body components. Such stress may cause power MOSFET devices to experience drain-source voltages in excess of their rated drain-source breakdown voltage (BVdss).

Power MOSFET devices are also used to switch inductive loads such as motors and transformers. When the power MOSFET device is switched off, the energy stored in the inductor will force the drain voltage of the power MOSFET to rise rapidly above the supply voltage. If no limiting means are employed, this rise will continue until the drain-source avalanche voltage of the power MOSFET is reached whereupon the energy stored in the inductor will dissipate in the power MOSFET during device avalanche. Such dissipation can cause avalanche stress induced failure of the power MOSFET. Although the inductive load can be dissipated by external devices, it is very advantageous for the power MOSFET device to be able to dissipate the stored inductive energy without using external circuits.

It is well known that power MOSFET devices provide more safe operating area if the gate is turned on prior to the MOSFET device reaching its drain-source breakdown voltage. The safe operating area (SOA) when the gate is turned on is referred to as the forward bias safe operating area or FBSOA. In FBSOA mode current can be dissipated throughout the body of the MOSFET device using channel structures within in the device that are optimized for maximum current flow. Because the on resistance under forward bias tends to increase with temperature, the device is self stabilizing and resists the occurrence of hotspots that can cause catastrophic destruction of the device.

However, if the MOSFET device reaches its BVDSS, current and breakdown flows in highly localized areas about the surface of the chip often at the edge of the MOSFET device. This causes "hotspots" of current in which resistance to current flow decreases with increasing temperature. Hence, device destruction occurs rapidly when a reverse breakdown voltage occurs. This is called reverse bias safe operating area or RBSOA.

One method of protecting against RBSOA failures involves diverting a small fraction of the drain-source energy to the power MOSFET gate by means of a drain-gate clamp diode whose avalanche voltage is about two to three volts less than the avalanche voltage of the power MOSFET. When rising drain voltage reaches the avalanche voltage of the drain-gate clamp diode, the resulting avalanche current develops a voltage across a gate-source termination resistor that turns on the power MOSFET, effectively clamping its drain to the sum of the drain-gate diode avalanche voltage and the voltage across the gate-source termination resistor. In this manner, the MOSFET acts as its own clamp, and dissipates the excessive energy in the less stressful forward biased mode. A second blocking diode is used in back-to-back configuration with the drain-gate clamp diode to enable the gate-source voltage in normal operation to exceed the drain-source voltage.

Some state of the art power MOSFET devices include current limit circuitry to protect the load driven by the power MOSFET device from undesirable current levels. Several current limit circuits are known and power MOSFET devices are available with current limit circuitry integrated monolithically with the power MOSFET device. Essentially, most current limit devices include structures that tend to reduce the gate voltage when a current limit is reached. The limit current can be detected by a current mirror transistor connected in parallel with the high current power MOSFET device. The detected current typically drives a transistor that drains charge from the MOSFET gate when the current limit is reached. By removing charge from the gate upon reaching the current limit, the main power device is forced into saturation in which case a power MOSFET device acts substantially as a constant current source.

Current limit devices work relatively well in FBSOA mode. While the current flowing through the devices is less than the current limit, the transient voltage generated by turning off an inductive load can be dissipated in FBSOA mode. However, when the current limit is reached, the current limit circuitry tends to pull the gate voltage down by directing charge away from the power MOSFET gate. This action tends to increase the current flowing through a drain-gate clamp diode.

The increased current through the drain-gate clamp diode increases the breakdown voltage of the drain-gate clamp diode beyond the breakdown voltage of the drain-source diode within the field effect transistor. When the inductor transient voltage increases beyond the drain-source breakdown voltage, the device enters reverse bias SOA mode and destructive failure occurs rapidly. The need exists for a power MOSFET device with both current limit capability to protect the loads and an ability to disable the current limit circuitry when the device must dissipate a large stored inductive energy.

SUMMARY OF THE INVENTION

Briefly stated, the present invention involves an integrated circuit having a protected output field effect transistor (FET). A drain-gate clamp circuit is coupled to divert charge from the power FET drain electrode to the power FET gate electrode when excessive drain-source voltage is present. A drain-source current limit circuit is coupled to divert charge from the power FET gate electrode to the power FET source electrode when a preselected drain-source current is achieved. A current limit inhibit circuit is coupled between the current limit circuit and the power FET gate electrode, and having a control electrode coupled to the drain-gate clamp circuit. The current limit inhibit circuit disables the current limit circuit when charge flows in the drain-gate clamp circuit.

In another aspect, a method of protecting a field effect transistor in accordance with the present invention includes the steps of sensing when a drain current in the FET is at a preselected current level and sensing when a drain-source voltage is above a preselected voltage level. The gate charge is moderated to maintain the drain current at or below the preselected level until the preselected voltage level is sensed. In response to sensing the preselected voltage level, the moderation of the gate charge is interrupted until the preselected voltage is no longer sensed. In this manner, the FET can dissipate energy caused by the voltage in excess of the preselected voltage level in a forward biased mode.

These and other objects, features and advantages of the invention will be apparent to those skilled in the art from the following detailed description of the invention, when read in conjunction with the accompanying drawings and appended claims.

BRIEF DESCRIPTION OF THE DRAWING

In the various figures of the drawing, like reference numerals are used to denote like or similar parts.

DETAILED DESCRIPTION OF THE PREFERRED EMBODIMENTS

Figure 1:
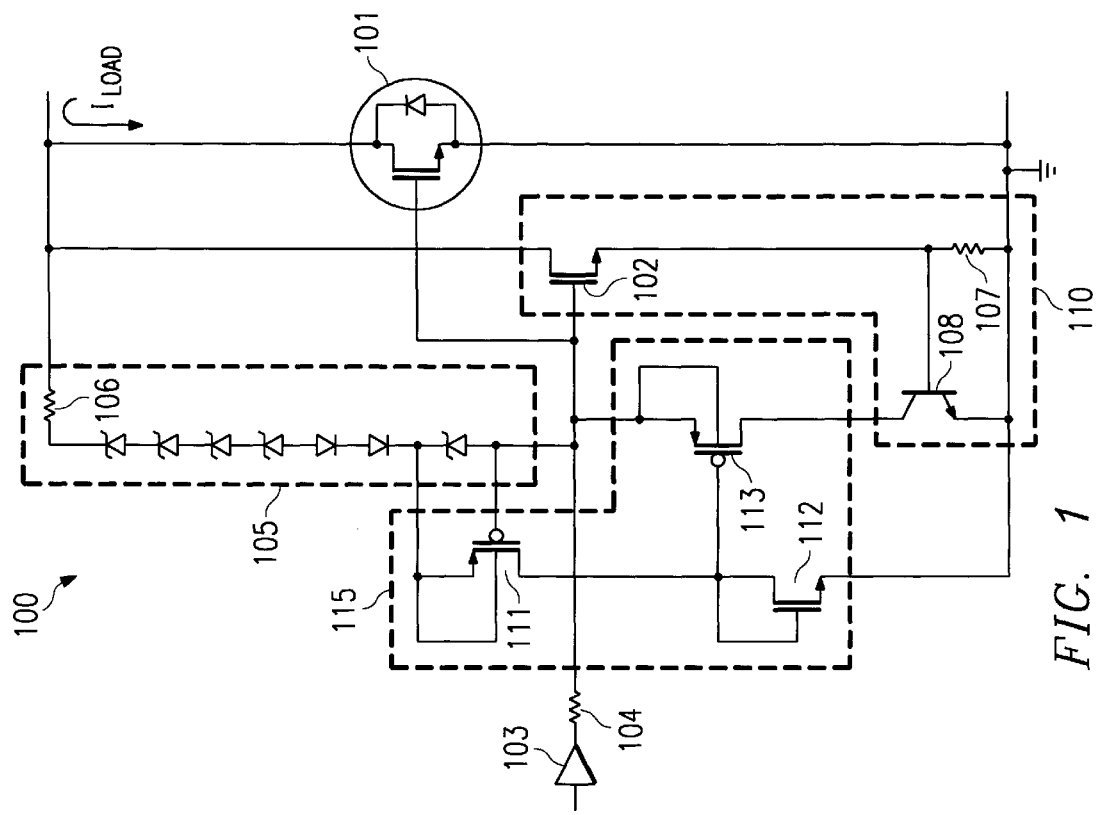
FIG. 1 shows a schematic diagram of a circuit in accordance with a first embodiment of the present invention.

FIG. 1 illustrates a power device with current limit and improved safe operating area in accordance with the present invention. The present invention is described in terms of a power MOSFET with associated protection circuitry. However, the protection circuits in accordance with the present invention can be adapted to protect a bipolar transistor. Also, the preferred embodiment comprises an N-channel power field effect transistor, however, the circuits can be adapted with appropriate polarity changes to protect a P-channel power MOSFET.

The protection circuit in accordance with the present invention comprises an integrated circuit having a protected output field effect transistor (FET) 101 shown in FIG. 1. A drain-gate clamp circuit 105 is coupled to divert charge from the power FET drain electrode to the power FET gate electrode when excessive drain-source voltage is present. A drain-source current limit circuit 110 including elements labeled 102, 107 and 108 in FIG. 1 is coupled to divert charge from the power FET gate electrode to the power FET source electrode when a preselected drain-source current is achieved. A current limit inhibit circuit 115 including devices 111, 113 and 112 is coupled between the current limit circuit and the power FET gate electrode, and having a control electrode coupled to the drain-gate clamp circuit. Current limit inhibit circuit 115 disables current limit circuit 110 when charge flows in drain-gate clamp circuit 105.

More specifically, power MOSFET device 100 includes a main power MOSFET 101 having drain and source electrodes adapted to couple to a load and conduct a load current $I_{Load}$. Power MOSFET 101 is an N-channel MOSFET in the preferred embodiment and is designed to carry the bulk of the load current $I_{Load}$ when operating in a forward biased mode. Any known technology can be used to form power MOSFET 101. Conveniently, power MOSFET 101 comprises multiple cells connected in parallel where the on resistance and current limit capability of the power device are determined by the number of cells and the total channel width provided by those cells. MOSFET 101 includes an integral drain-source diode as indicated in FIG. 1. A significant advantage of the circuit in accordance with the present invention is the ability to dissipate energy without breaking down this integral drain-source diode.

In normal operation, drive circuit 103 supplies charge to the gate of power MOSFET 101 through gate-source resistor 104. The value of resistor 104 is chosen to provide an acceptable charging time for the gate capacitance of MOSFET 101 while at the same time allowing the current limit circuitry and clamp circuitry (described hereinafter) to overdrive driver circuit 103 when necessary to protect MOSFET 101. A typical value for resistor 104 is 10K Ohms.

Transistor 102 is a current mirror transistor used for the current limit circuit 110. Conveniently, when a cellular design is used for power MOSFET 101, a few of the cells are isolated from the source of power MOSFET 101 and used to form current mirror transistor 102. In this manner, current mirror transistor 102 has the same threshold voltage and drain-source breakdown voltage as MOSFET 101. The current flowing through current mirror transistor 102 is substantially proportional to the current flowing through MOSFET 101 in a proportion roughly determined by the relative channel width of transistor 102 to MOSFET 101.

Drain-gate clamp 105 preferably comprises a number of Zener clamp diodes coupled in series and having a cathode end of the series coupled to the drain of MOSFET 101 and an anode end of the series coupled to the gate of MOSFET 101. Clamp 105 desirably includes one or more blocking diodes in back-to-back configuration with respect to the Zener diodes to allow the gate voltage to exceed the drain voltage in normal operation. Drain-gate clamp 105 is designed to have a breakdown voltage slightly less than the drain-source breakdown voltage of MOSFET 101 but greater than the largest voltage expected across the drain-source electrodes in normal use. Drain-gate clamp 105 is conveniently formed using diffused single crystal or poly-silicon diodes in a monolithic device.

Drain-gate clamp 105 has a significant parasitic resistance indicated as resistor 106 in FIG. 1. During drain-source voltage stress, drain-gate clamp 105 breaks down allowing current flow to charge the gate of power MOSFET 101. Current flowing through drain-gate clamp 105 develops a voltage across resistor 104 sufficient to turn on MOSFET 101. Hence, drain-gate clamp 105 tends to place MOSFET 101 in a forward bias safe operating area mode before reaching the drain-source breakdown voltage.

While $I_{Load}$ is less than the current limit ($I_{Lim}$), the voltage developed across sense resistor 107 is insufficient to turn on current limit transistor 108. The value of resistor 107 and the current mirror ratio of transistor 102 are chosen such that when $I_{load}=I_{lim}$ transistor 108 is turned on, drawing current away from the gate of MOSFET 101 through inhibit transistor 113.

Alternatively, current limit circuits are known that place a low value sense resistor directly in the path of the load current $I_{Load}$. A voltage developed across the sense resistor triggers a current limit switch analogous to transistor 108. These types of current limit circuits are difficult to manufacture because of the difficulty of making the precision low value resistor. Also, by placing the sense resistor in the load current loop, power loss occurs in the sense resistor. However, these types of current limit circuitry are adaptable to the teachings of the present invention and may be more appropriate for bipolar power transistors as they eliminate the need for current mirror transistor 102. Any current limit circuit that detects and generates a signal when the load current is at or above a preselected current limit is an acceptable substitute for the specific current limit circuit 110 described in the preferred embodiments.

Inhibit transistor 113 is a P-channel transistor coupled between the gate of power MOSFET 101 and a collector of the current limit transistor 108. During normal operation, including current limit operation, inhibit transistor 113 is turned on by action of pull down device 112. The gate of transistor 113 is also coupled to the drain of transistor 111. The gate and source of transistor 111 are coupled across one or more of the clamp diodes in drain-gate clamp 105.

In a preferred embodiment, the gate of transistor 111 is coupled to the anode end of a selected one of the series coupled diodes (i.e., the last diode in clamp 105 or the diode coupled directly to the gate electrode of MOSFET 101). In the preferred example, the source of transistor 111 is coupled to the cathode of the selected one of the series coupled diodes. Alternatively, the gate and source of transistor 111 can be coupled across a resistive element (either intentional or parasitic) in series with clamp 105. Such a resistance is similar to resistor 106, but would preferably be at a potential closer to the voltage on the gate of MOSFET 101 to avoid excessive voltage transfer to the other components. Any element that results in a gate-source voltage sufficient to turn on transistor 111 when current flows in drain-gate clamp 105 is equivalent to using the last diode in clamp 105 shown in FIG. 1.

Transistor 111 comprises a P-channel MOSFET transistor in the preferred embodiment shown in FIG. 1. Transistor 111 will be turned off in normal operation (i.e., in the absence of drain-source overvoltage stress) because current does not flow through drain-gate clamp 105 so that the source voltage of transistor 111 is essentially equal to gate voltage. When excessive drain-source voltage exists, transistor 111 detects the current flow in clamp 105 as an overvoltage signal.

Under a soft inductive short circuit, the circuit limit circuitry (i.e., MOSFET 102, resistor 107, and transistor 108) continue to operate in a conventional manner until the inductive energy stored in the load causes the drain voltage of MOSFET 101 to rise. The drain voltage will rise until clamp 105 breaks down resulting in current flow through drain-gate clamp 105. Current flow through clamp 105 causes the gate-source voltage across the selected diode in clamp 105 to turn on transistor 111. Transistor 112 has sufficient impedance such that when transistor 111 is turned on, the voltage on the gate of transistor 113 rises sufficiently to turn transistor 113 off. By turning transistor 113 off, current limit circuit (110) is effectively disabled. Transistor 113 is placed in the current path used by current limit transistor 108 to divert charge away from the gate of MOSFET 101. By placing transistor 113 in a high impedance state, this current path is interrupted and the current limit circuit 110 cannot inhibit charging of the gate of MOSFET 101 through the gate-drain clamp 105.

Because pull down device 112 is a relatively high impedance device, little current is required to disable the current limit circuit 110. In the preferred embodiment, pull down device 112 is implemented as an N-channel transistor with a gate shorted to its own drain and source coupled to the source electrode of MOSFET 101. Pull down device could alternatively be implemented as a high fixed resistance, however, some performance sacrifice will be made. The magnitude of current flow through drain-gate clamp 105 will be primarily controlled by the ratio of the gate voltage of MOSFET 101 to resistor 104. The voltage on the gate of MOSFET 101 is determined primarily by the gain of current mirror transistor 102 (i.e., the ratio of current mirror 102 to MOSFET 101 channel width). Hence, the current through drain-gate clamp 105 can be kept relatively low by proper sizing of resistor 104 even though the current limit circuit 110 has been disabled.

Figure 2:
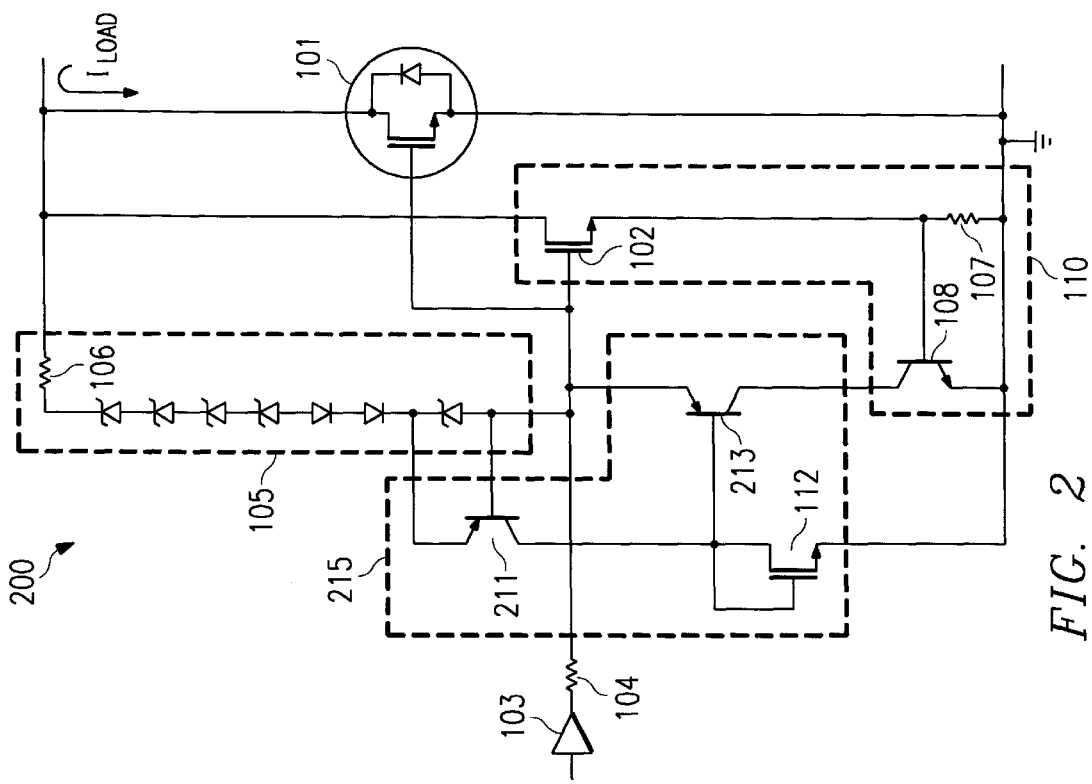
FIG. 2 shows a schematic diagram of a circuit in accordance with a second embodiment of the present invention.

FIG. 2 illustrates an alternative embodiment in accordance with the present invention. Like reference numerals are used to denote like or similar parts. In FIG. 2, current limit inhibit circuit 115 is replaced by current limit inhibit circuit 215. As compared to the embodiment of FIG. 1, transistor 111 is replaced by PNP transistor 211 and inhibit transistor 113 is replaced by PNP inhibit transistor 213. In this embodiment, current flow through gate-drain clamp 105 results in base current flow in transistor 211. The collector voltage of transistor 211 is coupled to the base of inhibit transistor 213 and becomes sufficient to turn off inhibit transistor 213. When inhibit transistor 213 is deactivated, transistor 108 is not able to drain charge from the gate of MOSFET 101. As in the first embodiment, the base and emitter of PNP inhibit transistor 213 may alternatively be coupled across a resistor in series with drain-gate clamp 105.

By now it should be understood that improved power MOSFET devices with current limit circuitry and increased safe operating area are provided. By using active devices to disable the current limit circuitry in the case of a soft shorted load condition, inductive energy can be dissipated safely and reverse bias breakdown of the drain-source diode within the power device avoided during overvoltage stress. Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A protection circuit for a power field effect transistor (FET), the power FET having a gate, source and drain electrodes, the protection circuit comprising:

a drain-gate clamp circuit coupled to divert charge from the power FET drain electrode to the power FET sate electrode when a preselected drain-source voltage is present;

a drain-source current limit circuit coupled to divert charge from the power FET gate electrode to the power FET source electrode when a preselected drain-source current occurs;

a current limit inhibit circuit coupled between the current limit circuit and the power FET gate electrode, and having a control electrode coupled to the drain-gate clamp circuit, wherein the current limit inhibit circuit disables the current limit circuit when charge flows in the drain-gate clamp circuit;

wherein the current limit inhibit circuit further comprises:

a first switch having a control electrode coupled to the drain-gate clamp circuit, wherein the first switch is activated by charge from the drain-gate clamp;

a second switch having a control electrode coupled to an output of the first switch, wherein the second switch is turned off when the first switch is activated; and a pull down device coupled between the control electrode of the second switch and the power FET source electrode, wherein the pull down device holds the second switch in a conductive state until the first switch is activated.

2. The protection circuit of claim 1 wherein the drain-gate clamp circuit comprises a diode having a cathode coupled to the power FET drain and an anode end coupled to the power FET gate electrode, and the current limit inhibit circuit further comprises:

a resistor coupled in series with the drain-gate clamp, a first end of the resistor coupled to the control electrode of the current limit inhibit circuit and a second end of the resistor coupled to the gate of the power FET.

3. A protection circuit for a power field effect transistor (FET), the power FET having a gate, source and drain electrodes, the protection circuit comprising:

a drain-gate clamp circuit coupled to divert charge from the power FET drain electrode to the power FET gate electrode when a preselected drain-source voltage is present;

a drain-source current limit circuit coupled to divert charge from the power FET gate electrode to the power FET source electrode when a preselected drain-source current occurs;

a current limit inhibit circuit coupled between the current limit circuit and the power FET gate electrode, and having a control electrode coupled to the drain-gate clamp circuit, wherein the current limit inhibit circuit disables the current limit circuit when charge flows in the drain-gate clamp circuit;

wherein the drain-gate claim circuit comprises a plurality of series coupled diodes having a cathode end of the series coupled to the power FET drain and an anode end of the series coupled diodes coupled to the power FET gate electrode, and the current limit inhibit circuit further comprises:

a first P-channel field effect transistor (FET) having a gate coupled to the anode of a selected one of the series coupled diodes and a source coupled to a cathode of the selected one of the series coupled diodes;

a second P-channel FET having a gate coupled to the drain of the first P-channel FET, a source coupled to the power FET gate electrode, and a drain coupled to the current limit circuit; and a pull down device coupled between the gate electrode of the second P-channel FET and the power FET source electrode, wherein the pull down device holds the second P-channel FET in a conductive state until the first P-channel FET is turned on.

4. A protection circuit for a power field effect transistor (FET), the power FET having a gate, source and drain electrodes, the protection circuit comprising:

a drain-gate clamp circuit coupled to divert charge from the power FET drain electrode to the power FET gate electrode when a preselected drain-source voltage is present;

a drain-source current limit circuit coupled to divert charge from the power FET gate electrode to the power FET source electrode when a preselected drain-source current occurs;

a current limit inhibit circuit coupled between the current limit circuit and the power FET gate electrode, and having a control electrode coupled to the drain-gate clamp circuit, wherein the current limit inhibit circuit disables the current limit circuit when charge flows in the drain-gate clamp circuit;

wherein the drain-gate clamp circuit comprises a plurality of series coupled diodes having a cathode end of the series coupled to the power FET drain and an anode end of the series coupled diodes coupled to the power FET gate electrode, and the current limit inhibit circuit further comprises:

a first PNP transistor having a base coupled to the anode of a selected one of the series coupled diodes and an emitter coupled to a cathode of the selected one of the series coupled diodes;

a second PNP transistor having a base coupled the collector of the first PNP transistor, an emitter coupled to the power FET gate electrode, and a collector coupled to the current limit circuit; and a pull down device coupled between the base of the second PNP transistor and the power FET source electrode, wherein the pull down device holds the second PNP transistor in a conductive state until the first PNP transistor is turned on.

5. The protection circuit of claim 4 wherein the pull down device comprises:

an N-channel field effect transistor having a source coupled to the power FET source, a drain coupled to the control electrode of the second switch, and a gate coupled to the control electrode of the second switch.

6. A protection circuit for a power field effect transistor (FET), the power FET having a gate, source and drain electrodes, the protection circuit comprising:

a drain-gate clamp circuit coupled to divert charge from the power FET drain electrode to the power FET gate electrode when a preselected drain-source voltage is present;

a drain-source current limit circuit coupled to divert charge from the power FET gate electrode to the power FET source electrode when a preselected drain-source current occurs;

a current limit inhibit circuit coupled between the current limit circuit and the power FET gate electrode, and having a control electrode coupled to the drain-gate clamp circuit, wherein the current limit inhibit circuit disables the current limit circuit when charge flows in the drain-gate clamp circuit;

wherein the drain-source current limit circuit further comprises:

a current mirror FET having a gate coupled to the power FET gate, a drain coupled to power FET drain, and a source;

a sense resistor coupled between the current mirror source and the power FET source; and a current limit transistor having a base coupled to the current mirror source, an emitter coupled to the power FET source, and a collector coupled to the power FET gate through the current limit inhibit circuit.

7. An integrated circuit having a protected output field effect transistor (FET) comprising:

a signal driver having an input and an output node;

a resistor coupled between the signal driver output node and a gate of the output FET;

a current mirror FET having a gate coupled to the output FET gate, a drain coupled to output FET drain, and a source;

a sense resistor coupled between the current mirror source and the output FET source;

a current limit transistor having a base coupled to the current mirror source, an emitter coupled to the output FET source, and a collector;

plurality of series coupled diodes having a cathode end of the series coupled to the output FET drain and an anode end of the series coupled diodes coupled to the output FET gate;

a first P-channel FET having a gate coupled to the anode of a selected one of the series coupled diodes, a source coupled to a cathode of the selected one of the series coupled diodes, and a drain;

a second P-channel transistor having a source coupled to the output FET gate, a drain coupled to the current limit transistor collector, and a gate coupled to the drain of the first P-channel FET; and a pull down device coupled between the output FET source and the gate of the second P-channel FET.

8. The integrated circuit of claim 7 wherein the pull down device has sufficient impedance to allow the first P-channel FET drain to drive a voltage onto the second P-channel FET gate.

9. The integrated circuit of claim 7 wherein the selected one of the series coupled diodes has a breakdown voltage greater than the threshold voltage of the first P-channel FET.

10. The integrated circuit of claim 7 wherein the anode of the selected one of the series coupled diodes is coupled to the gate of the output FET.

11. A current limited switching device with improved safe operating area comprising:

a power switching device having a control electrode and two current carrying electrodes;

a current sense device for generating a current limit signal when current in the two current carrying electrodes is at or above a predetermined current level;

a current limit device coupled to the current sense device and the control electrode, wherein the current limit device is responsive to the current limit signal to direct charge away from the control electrode;

a voltage sense device for generating a voltage limit signal when voltage across the two current carrying electrodes is at or above a predetermined voltage level; and an interrupt device responsive to the voltage limit signal for disabling the current limit device;

wherein said interrupt device comprises a first switch that is turned on in response to the voltage limit signal and a second switch coupled between the current limit device and the control electrode, said second switch being turned off in response to said first switch being turned on.

12. The current limited switching device of claim 11 wherein the voltage sense device comprises:

back-to-back diodes coupled between one of the current carrying electrodes and the control electrode; and a resistor in series with the back-to-back diodes, wherein the voltage limit signal is generated across the resistor when voltage between one of the two current carrying electrodes and the control electrode is sufficient to break down one of the back-to-back diodes.

13. The current limited switching device of claim 11 wherein the voltage sense device comprises:

a plurality of series coupled back-to-back diodes coupled between one of the two current carrying electrodes an the control electrode, wherein the voltage limit signal is generated across a selected one of the back-to-back diodes when voltage between one of the two current carrying electrodes and the control electrode is sufficient to break down the selected one of the back-to-back diodes.

* * * * *